US008830638B2

(12) United States Patent
Taneja

(10) Patent No.: US 8,830,638 B2
(45) Date of Patent: Sep. 9, 2014

(54) HIGH EFFICIENCY SWITCHING METHOD AND APPARATUS FOR DYNAMICALLY CONNECTING OR DISCONNECTING MUTUALLY COUPLED INDUCTIVE COILS

(76) Inventor: Sandeep Taneja, New Delhi (IN)

( * ) Notice: Subject to any disclaimer, the term of this patent is extended or adjusted under 35 U.S.C. 154(b) by 368 days.

(21) Appl. No.: 13/452,710

(22) Filed: Apr. 20, 2012

(65) Prior Publication Data
US 2012/0268858 A1 Oct. 25, 2012

(30) Foreign Application Priority Data
Apr. 21, 2011 (IN) .......................... 1185/DEL/2011

(51) Int. Cl.
H02H 9/00 (2006.01)
H03K 17/64 (2006.01)
H02M 3/335 (2006.01)
H02M 3/337 (2006.01)

(52) U.S. Cl.
CPC .............. H02M 3/337 (2013.01); H03K 17/64 (2013.01); H02M 3/33569 (2013.01)
USPC .......................................................... 361/18

(58) Field of Classification Search
USPC ................................................... 361/18, 152
See application file for complete search history.

(56) References Cited

U.S. PATENT DOCUMENTS

| 3,003,069 | A | * | 10/1961 | Clapper | 327/217 |
| 3,316,423 | A | * | 4/1967 | Hull | 327/199 |
| 3,458,732 | A | | 7/1969 | Robinson | |
| 3,988,643 | A | * | 10/1976 | Morris | 361/18 |
| 3,996,498 | A | * | 12/1976 | Schade, Jr. | 361/18 |
| 4,367,509 | A | | 1/1983 | Snyder et al. | |
| 4,410,810 | A | | 10/1983 | Christen | |
| 4,418,374 | A | | 11/1983 | Callan | |
| 4,497,017 | A | * | 1/1985 | Davis | 363/49 |
| 5,003,426 | A | * | 3/1991 | Yeh et al. | 361/59 |
| 5,168,435 | A | * | 12/1992 | Kobayashi et al. | 363/20 |
| 6,018,469 | A | | 1/2000 | Poon | |
| 2001/0038640 | A1 | | 11/2001 | McKinnon, III et al. | |
| 2005/0156643 | A1 | * | 7/2005 | Edwards | 327/217 |
| 2009/0122452 | A1 | * | 5/2009 | Okushima | 361/56 |
| 2009/0262476 | A1 | * | 10/2009 | Mallikararjunaswamy | 361/56 |
| 2011/0235228 | A1 | * | 9/2011 | Salcedo et al. | 361/111 |
| 2012/0049832 | A1 | * | 3/2012 | Shinyama | 323/299 |
| 2013/0308231 | A1 | * | 11/2013 | Shan et al. | 361/56 |

FOREIGN PATENT DOCUMENTS

EP 2515428 A2 * 10/2012
EP 2515428 A3 * 10/2013

* cited by examiner

Primary Examiner — Ronald W Leja
(74) Attorney, Agent, or Firm — Maschoff Brennan

(57) ABSTRACT

A switching apparatus allows coupled coils to be dynamically switched in or out of a circuit using small control currents. The apparatus includes at least one latching circuit, one or more control circuits and diodes. The latching circuit may have two bipolar transistors connected in a transistor latch configuration with at least two diodes, such that at least one diode may be connected in series with a base of the each bipolar transistor. The control circuits may be connected to the latch circuit for operating the bipolar transistors. The diodes may be connected in the circuit for protecting the latching and control circuits from being exposed to high voltages and currents during the turn-off or turn-on of the inductor coils. This allows overall efficiency levels to be maintained while changing the inductance of the circuit as per requirements. The circuits may be used in switch mode power supplies (SMPS).

12 Claims, 8 Drawing Sheets

HIGH EFFICIENCY SWITCHING METHOD AND APPARATUS FOR DYNAMICALLY CONNECTING OR DISCONNECTING MUTUALLY COUPLED INDUCTIVE COILS

FIELD OF THE INVENTION

This invention generally relates to the field of power electronics and particularly to switching apparatus in power converters.

BACKGROUND OF THE INVENTION

Electronic power convertor circuits and present day switch mode power supplies (SMPS) use switching topologies (half bridge, full bridge etc.) which allow for efficient power conversion with a fixed inductance. However their performance envelope is limited due to this fixed inductance. If the inductance could be changed that is mutually coupled inductors could be switched in or out of power convertor circuits as per requirement then their performance envelope could be enhanced. Known switching apparatuses have large turn-on and turn-off current requirements, which make it practically impossible to use them in a power converters and switch mode power supplies. Further, since the inductive coils carry large currents they cannot be switched dynamically in or out of a circuit, changing its inductance, with any level of efficiency or reliability.

Particularly, the known switching apparatus in a power converter results in excessive turn-on and turn-off losses and in high level of EMI/RFI emissions due to rapidly switching large currents.

Hence, there is a well-felt need for a switching apparatus for power converter circuits that may operate on relatively small current and may at least overcome one or the other above-mentioned drawback of the known switching apparatus.

The subject matter disclosed herein is not limited to embodiments that solve any disadvantages or that operate only in environments such as those described above. Rather, this background is only provided to illustrate one exemplary technology area where some embodiments described herein may be practiced.

SUMMARY

With a view to overcome or at help to alleviate one or more of the above drawbacks, a switching apparatus for dynamically switching in or out a inductor coil from a circuit having at least two mutually coupled inductor coils is disclosed.

According to an embodiment of the invention, the disclosed switching apparatus may be used for dynamically switching in or out an inductor coil from a circuit having at least two mutually coupled inductor coils, the circuit being driven by a modulated drive circuit(s) and have a dead time between the switching cycles of the coils. According to an embodiment, the coils may have equal or unequal inductance values. The apparatus includes at least one latching circuit, one or more control circuits and a plurality of diodes.

The latching circuit may have two bipolar transistors connected in a transistor latch configuration along with at least two diodes, such that at least one diode may be connected in series with a base of the each bipolar transistor. According to an embodiment, the bipolar transistors may be of PNP or NPN configuration. According to another embodiment, the switching apparatus may have only one latching circuit to provide a unidirectional switch configuration. According to yet another embodiment, the switching apparatus may have two latching circuits to provide a bidirectional switch configuration.

The control circuits may be connected to the latch circuit for operating the bipolar transistors. The control circuit keeps the latching circuit on or off, such that the control circuits provide a constant steady forward bias to keep the latch circuit on and a constant steady reverse bias to keep the latch circuit off. The bias being changed only when the inductor coils need to be switched in (latch circuit on) or out (latch circuit off) of the circuit. To turn-on the latching circuit, a forward bias voltage may be applied and to turn-off the latching circuit a reverse bias voltage may be applied, during the dead time of the switching cycles. According to an embodiment, the forward bias voltage is relatively very small as compared to the reverse bias voltage. According to another embodiment, the reverse bias voltage is at least +/−5 volts.

The plurality of diodes may be connected in the circuit for protecting the latching circuit and the control circuits from being exposed to high voltages and currents during the turn-off or turn-on of the inductor coils.

According to another embodiment, the switching apparatus may further comprises at least two control circuits, such that at least one circuit is connected to each bipolar transistor and at least one diode isolate the control circuits between the bipolar transistors in the latching circuit. According to yet another embodiment, the control circuit may include at least one keep on circuit and at least one keep off circuit connected to each transistor.

According to yet another embodiment, the switching apparatus further have a turn-on/turn-off indication circuit coupled with the latching circuit.

BRIEF DESCRIPTION OF THE DRAWINGS

The patent or application file contains at least one drawing executed in color. Copies of this patent or patent application publication with color drawing(s) will be provided by the Office upon request and payment of the necessary fee. To further clarify the above and other advantages and features of the disclosure, a more particular description will be rendered by references to specific embodiments thereof, which are illustrated in the appended drawings. It is appreciated that the given drawings depict only some embodiments of the apparatus and are therefore not to be considered limiting of its scope. The embodiments will be described and explained with additional specificity and detail with the accompanying drawings in which.

DETAILED DESCRIPTION OF THE PREFERRED EMBODIMENTS

The invention primarily discloses a switching apparatus, which allows two or more coupled coils to be dynamically switched in or out of a circuit using small control currents. This allows overall efficiency levels to be maintained while changing the inductance of the circuit as per requirements. The primary use of the disclosed circuit is in switch mode power supplies (SMPS) and power convertors.

The disclosed switching apparatus is based on a modified transistor latching circuit. Typically forward switching converters have a dead time between the switching cycles driving the inductive coils. During the dead time there is no or minimal current flow through the switching elements and the inductive coils. The dead time interval may be used to switch the switching apparatus on and off. The disclosed transistor latch configuration may only require a minimal turn-on current as a small forward bias voltage may turn the latching switch on and keep it on. The regenerative action of the transistor latch will turn the switching apparatus on almost instantly while avoiding any turn-on losses connecting the two inductive coils. For turn-off the dead time period between the switching cycles may be used to reverse bias the latching transistors and turn the switching apparatus off. To turn-on and turn-off the latching circuit, 'Keep On' and 'Keep Off' circuits are used, either of which is activated during the dead time interval. Prior to the start of the next on switching cycle the activation of either the 'Keep On' or 'Keep Off' circuit, will ensure that the two inductive coils are connected or disconnected respectively while using small control currents.

Figure 1:
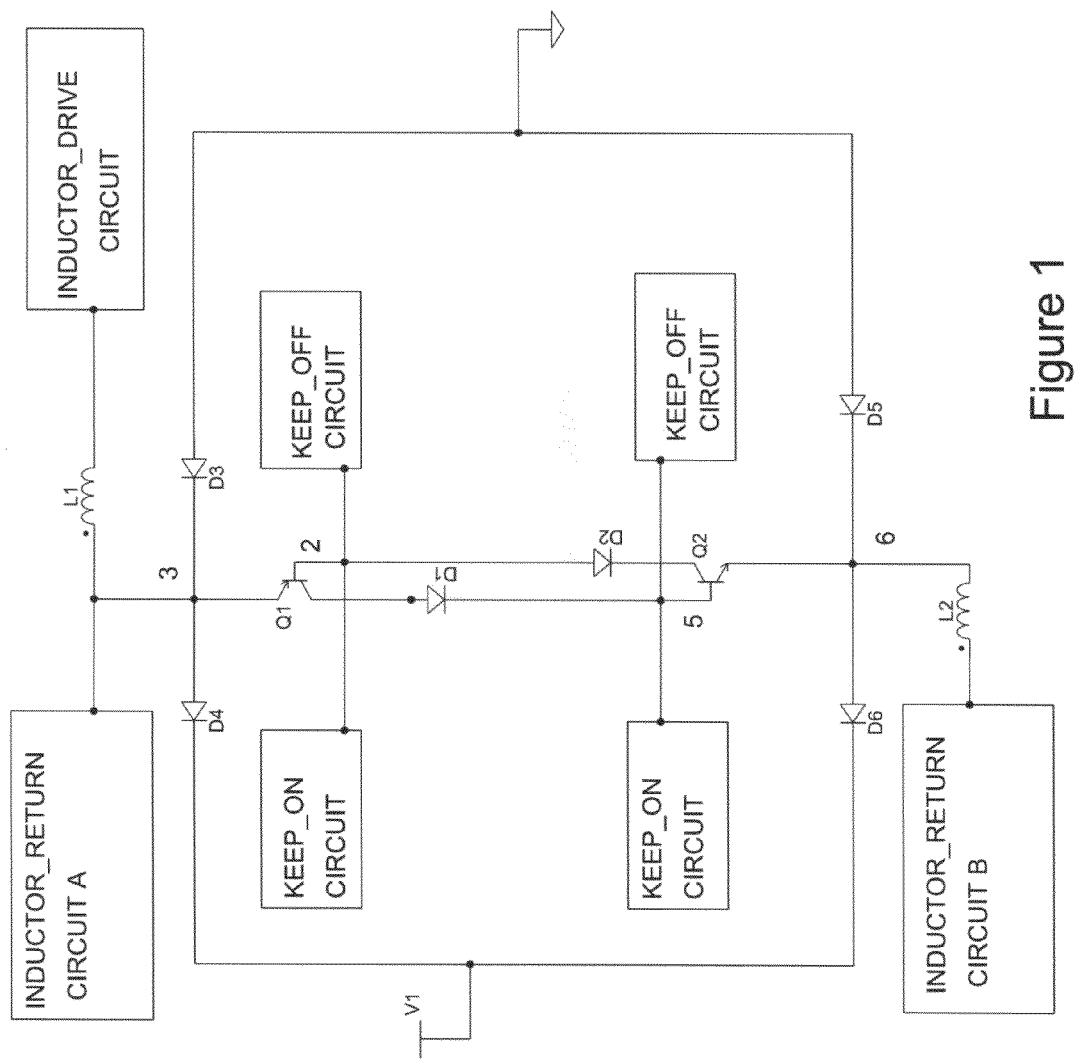
FIG. 1 illustrates a unidirectional latching switch apparatus according to an embodiment of the present invention.

FIG. 1 illustrates a block diagram of the unidirectional switching apparatus according to an embodiment. As illustrated, the apparatus includes at least one latching circuit, one or more control circuits and a plurality of diodes. The latching circuit may have two bipolar transistors Q1, Q2 connected in a transistor latch configuration along with at least two diodes D1, D2. According to an embodiment, one of the bipolar transistors Q1 have PNP configuration and the other bipolar transistors Q2 have NPN configuration.

The control circuits (keep on circuits and keep off circuits) may be connected to the latch circuit for operating the bipolar transistors Q1, Q2. The control circuit keeps the latching circuit on or off, such that the control circuits provide a constant steady forward bias to keep the latch circuit on, and a constant steady reverse bias to keep the latch circuit off. The bias being changed only when the inductor coils L1, L2 need to be switched in (latch circuit on) or switched out (latch circuit off) of the circuit. To turn-on the latching circuit a forward bias voltage may be applied and to turn-off the latching circuit a reverse bias voltage may be applied, during the dead time of the switching cycles.

The diodes D1 D2 are provided to isolate the keep on and keep off circuits of the bipolar transistors Q1, Q2 of the transistor latching circuit. The switching apparatus may further have plurality of other diodes D3, D4, D5, D6 that may act as fly back diodes to ensure that the latching transistors Q1 and Q2 and their respective control circuits are not exposed to high voltages and currents during the turn on and turn-off of inductor coils L1 and L2. Thus the transistors Q1, Q2 always operate within their safe operating area (SOA) under both forward and reverse bias conditions. It should be noted that coils L1 and L2 can be of equal or unequal inductance values.

The operation of the circuit according to an embodiment of the invention may be described as follows. Assume an initial condition when the latching circuit is switched off i.e. the latching transistors Q1 and Q2 are kept off via their respective active Keep Off circuits prior to the start of any switching action. When the inductor drive circuit starts its switching cycle, the current flow is through the inductor L1 and the inductor return circuit A. The coil L2 is electrically isolated from the L1 coil and only the inductance of the L1 coil is visible to the inductor drive circuit. Thus the Keep Off circuit by using the prior dead time state of the Inductor drive circuit keeps the latching circuit off during the on switching cycle. With the Keep Off circuit active, the voltage difference between the points 2 and 3 in FIG. 1 is positive by an amount V×1 and similarly the voltage difference between the points 5 and 6 is negative by an equal amount V×1. This keeps the transistors Q1 and Q2 reverse biased and prevents the transistor latching circuit from conducting. The typical V×1 voltage would be 5V for silicon transistors.

The switch on of the latching circuit happens in the dead time of the inductor drive circuit, prior to the upcoming on switching cycle. For turn-on a small positive bias voltage is applied to the latching transistors Q1 and Q2 via their respective Keep On circuits. At this point the Keep Off circuits are inactive. It should be noted that the Keep On and Keep Off circuits are operated in mutually exclusive fashion that is either the Keep On circuit is on and the Keep Off circuit is off or the Keep On circuit is off and the Keep Off circuit is on. Both of these circuits cannot be active at the same time. The inductor return circuit A is kept switched off. During the switching cycle the current flow is through the inductor coil L1 via the latching transistors Q1 and Q2, the inductor coil L2 and the inductor return circuit B. Hence the inductor drive circuit sees the combined inductance of the coils L1 and L2 with the latching switch circuit turned on. The voltage difference between points 2 and 3 of FIG. 1 is negative by an amount V×2. This forward biases the latching transistor Q1. Similarly the voltage difference between points 5 and 6 of the circuit is positive by an equal amount V×2. This forward biases the latching transistor Q2. With both the latching transistors forward biased the latching circuit is on and the same current flows through the inductors L1 and L2. According to an exemplary embodiment the typical V×2 voltage would be 0.7V for silicon transistors.

The Keep_Off and Keep_On circuits apply a constant and steady bias to the latching transistors during the on off switching cycles using a very low current. The change of the control bias only occurs when coils L1 and L2 need to be switched in or out as per requirements.

At this point it can also be noted that there can be a turn-on and turn-off indication circuit which will measure the voltage difference between the base and emitter of the latching transistors Q1 and Q2. These can be considered optional parts of the Keep_On and Keep_Off circuits. They can be used to provide feedback to the system controller to indicate when the latching transistor attain on or off state after the command has been given to the Keep_On or Keep_Off circuits of the latching switch. The purpose of these indicator circuits will be to allow for more reliable and faster system operation.

Figure 2:
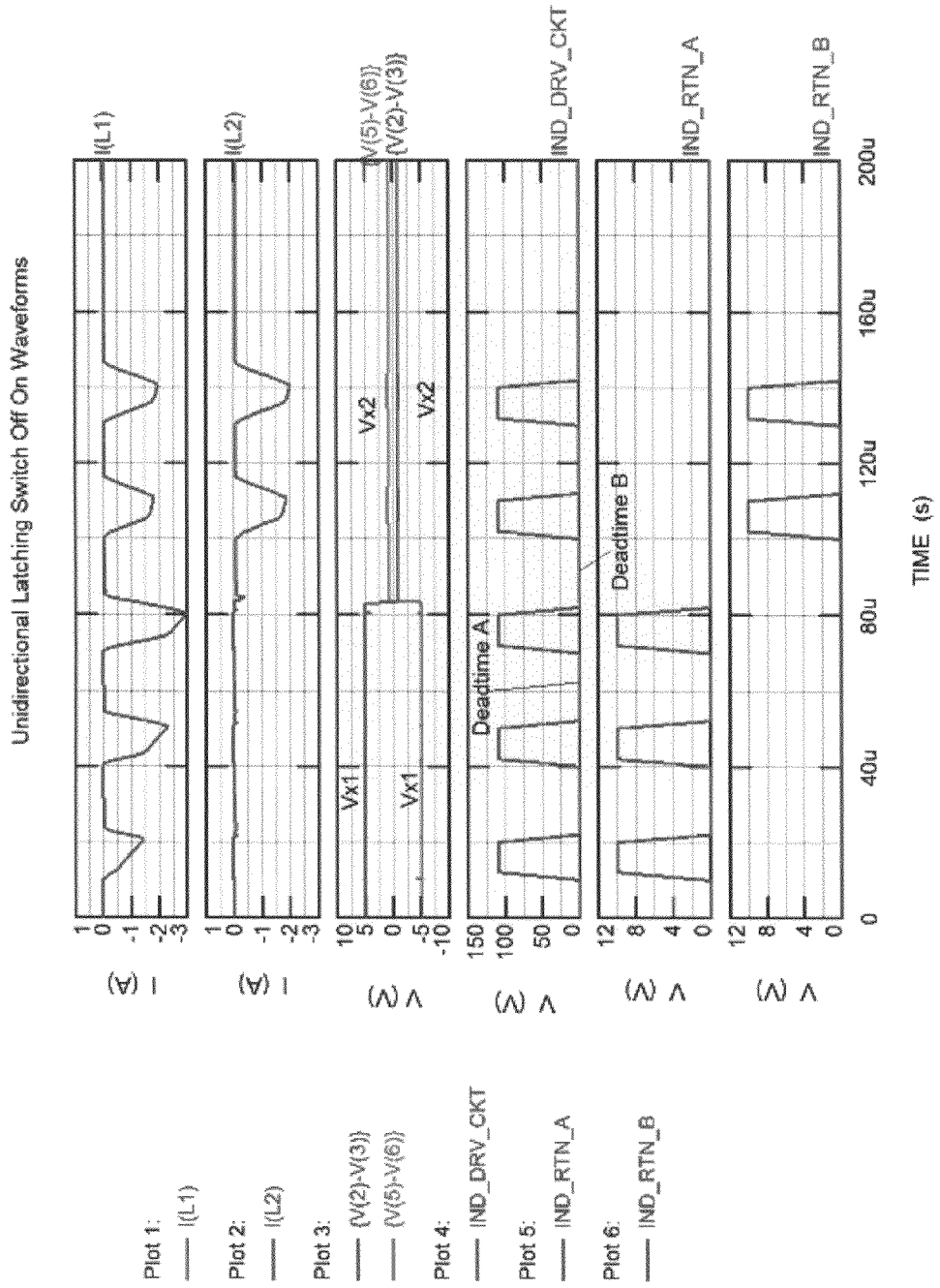
FIG. 2 illustrates unidirectional latching switch off on waveforms.

The above operation is illustrated by exemplary waveforms shown in FIG. 2. As the switch is initially off the current flow is only through the inductor L1 which is indicated in plot 1 of the figure. During this off state the base emitter voltage difference V(2)–V(3) and V(5)–V(6) is +5V and −5V respectively indicating that the transistors Q1 and Q2 are reverse biased. This may be noted by the V×1 label on the plot 3 of the FIG. 2. The inductor drive circuit and inductor return circuit A are active at this stage as indicated by plot 4 and plot 5 of FIG. 2. The turn-on of the switch is accomplished by forward biasing the transistors Q1 and Q2. Thus the base emitter voltage difference V(2)–V(3) and V(5)–V(6) is changed to −0.7V and +0.7V respectively, indicated by the V×2 label on plot 3. This action happens during the dead time start after the completion of the on switching cycle. In this exemplary case it is after the completion of the third on cycle as indicated on plots 3 and 4. The normal dead time between the switching cycles is denoted as Deadtime A. The dead time required for the apparatus to be switched on is denoted as Deadtime B. For off to on operation of the switch, Deadtime B can be equal to or greater than to Deadtime A. The latching switch is active and on the subsequent switching cycle the same current flows through the inductors L1 and L2 as indicated in plots 1 and 2. With the switch on, the inductor drive circuit along with inductor return circuit B is active as indicated in plots 4 and 6.

Being a transistor latching circuit the regenerative transistor action turns on each of the transistors Q1 and Q2 obviating the need for a large turn-on current. As long as the inductive coils L1 and L2 need to be electrically connected a continuous small forward bias voltage provided by the Keep On circuit to each of the transistors Q1 and Q2 will be sufficient to turn them on during the start of the each switching cycle.

If on the subsequent switching cycle the latching circuit is to be turned off then the Keep Off circuit is activated during the dead time preceding it and the Keep On circuit is turned off. The duration of this dead time can vary depending on the time required to evacuate all the minority charge carriers from the latching transistors Q1 and Q2. The latching switch will turn-off and electrically isolate inductive coil L2 from coil L1. The next on switching cycle the inductor drive circuit will see the coil L1 only. The Keep Off circuits will remain active as long as the latching circuit needs to be off.

Figure 3:
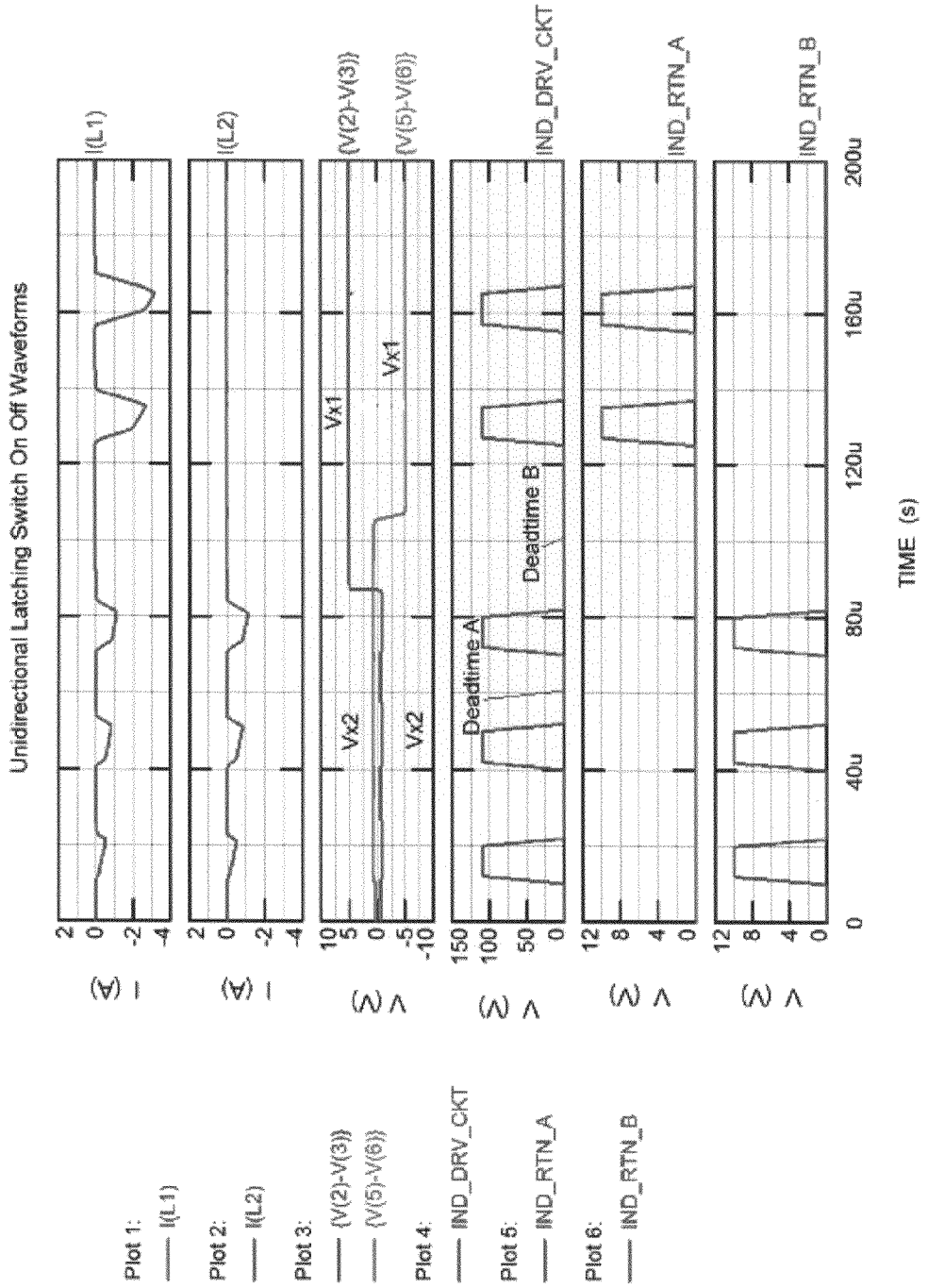
FIG. 3 illustrates unidirectional latching switch on off waveforms.

This stage of operation is more clearly explained via the waveforms in FIG. 3. Initially the latching switch is on. The base emitter voltage difference V(2)–V(3) is −0.7V and V(5)–V(6) is 0.7V. This voltage is indicated by V×2 in plot 3. The transistors Q1 and Q2 are forward biased and thus conducting. The same current is flowing through the inductors L1 and L2 as indicated in plots 1 and 2. The inductor drive circuit and the inductor return circuit B is active at this point as indicated in plots 4 and 6 of the FIG. 3. The turn-off of the switch is accomplished by reverse biasing the transistors Q1 and Q2. Thus the base emitter voltages V(2)–V(3) and V(5)–V(6) are changed to +5V and −5V respectively, indicated by the V×1 label on plot 3. This action happens during the dead time start after the completion of the on switching cycle. In this case it is after the completion of the third on cycle as indicated on plots 3 and 4. The normal dead time between the switching cycles is denoted as Deadtime A. The dead time required for the apparatus to be switched off is denoted as Deadtime B. For on to off operation of the switch, the Deadtime B has to be greater than Deadtime A. This is done to ensure that all the minority charge carriers are evacuated from the transistors Q1 and Q2 for proper turn-off. With the latching switch off, on the subsequent switching cycle, the flow of current is from the inductor drive circuit via coil L1 to the inductor return circuit A. There is no flow of current through coil L2. This is illustrated in plots 1, 2, 4 and 5 of the figure.

Figure 4:
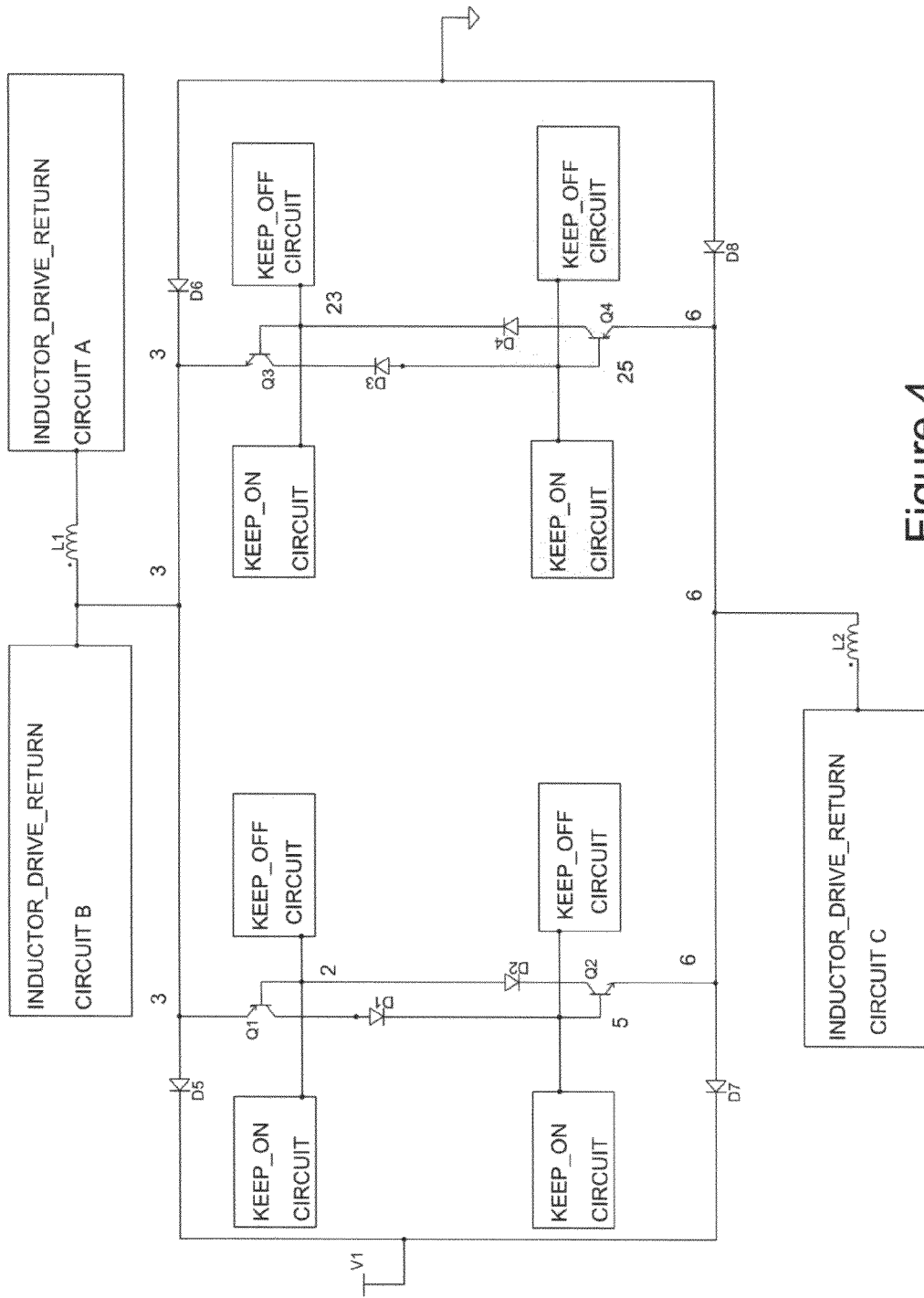
FIG. 4 illustrates a bidirectional latching switch apparatus according to an embodiment of the present invention.

FIG. 4 illustrates a bidirectional configuration of the circuit having switching apparatus according to another embodiment of the present invention. As illustrated, two unidirectional latching circuits, may be used with one configured for one direction of current flow and the other for the opposite direction of current flow. However, each latching circuit works as illustrated above. In FIG. 4 when the current flow is from point 3 to point 6 then it is via the transistors Q1 and Q2. When current flow is from point 6 to point 3 then it is via the transistors Q4 and Q3.

Assume that the initial condition of the latching switch is off. On the start of the switching cycle the current flows from the inductor drive return circuit A to inductive coil L1 and then to the inductor drive return circuit B. In the subsequent switching cycle the current flows from the inductor drive return circuit B to the coil L1 and then to inductor drive return circuit A. There is no flow of any current through the bidirectional latching circuit. The coil L2 is electrically isolated from coil L1. The latching transistors Q1 to Q4 are all reverse biased. The Keep Off circuits for all the four latching transistors are active. In FIG. 4, for transistor Q1, the voltage difference between points 2 and 3 is positive by a value V×1. The voltage difference between the points 23 and 3 is negative by the same value V×1 for transistor Q3. The same sets of conditions apply for the other two transistors Q2 and Q4. The voltage difference between the points 5 and 6 is negative by an amount V×1 and the voltage difference between the points 25 and 6 is positive by the same amount V×1. The approximate value for V×1 would be 5 volts for silicon transistors. These bias conditions will persist until the state of the latching circuit is to be changed from off to on.

The turn-on of the circuit is accomplished during the dead time period of the inductor drive return circuits A and B. The Keep Off circuits for all the four latching transistors are deactivated simultaneously and then the Keep On circuits for the same are activated. This provides a positive bias to all the four latching transistors Q1 to Q4. In the subsequent switching cycle, the inductor drive return circuit B is kept off and the inductor drive return circuit C is turned on. Hence the current flow, for one half of the switching cycle, is from inductor drive return circuit A to the coil L1 via the latching transistors Q1 and Q2 to coil L2 and finally to the inductor drive return circuit C. In the second half of the same switching cycle the current flow is from the inductor drive return circuit C to the coil L2 via the latching transistors Q4 and Q3 to coil L1 and finally to the inductor drive return circuit A. The coils L1 and L2 are hence electrically connected via the latching switching arrangement of transistors Q1 to Q4 and the same current can be driven bi-directionally through them. In FIG. 4 with all the Turn-on circuits activated the voltage difference between the points V(2)–V(3) and, V(25)–V(6) respectively is negative by an amount V×2. Similarly the voltage difference between the points V(5)–V(6) and V(23)–V(3) respectively is positive by an equal amount V×2. Exemplary the V×2 voltage is 0.7V for silicon transistors. These bias conditions on the latching transistors will persist until the state of the latching circuit is to be changed from on to off.

Figure 5:
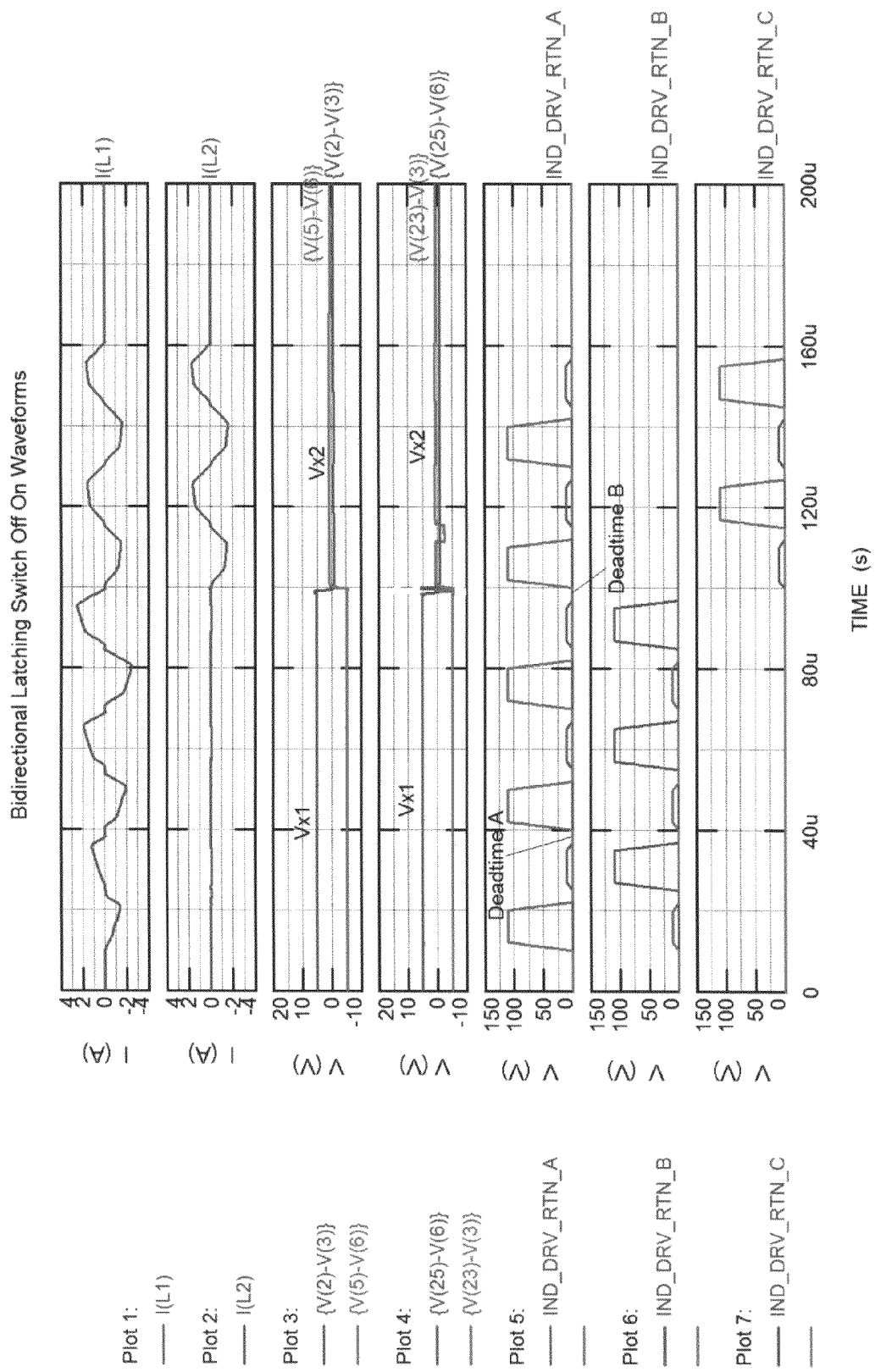
FIG. 5 illustrates bidirectional-latching switch off on waveforms.

The above operation from off to on is also described by the waveforms shown in FIG. 5. The initial condition of the bidirectional latching switch is off. There is flow of current only through the coil L1 in both directions, and no current flows through to coil L2. This is indicated by plots 1 and 2 of FIG. 5. The base emitter voltage of all the four transistors Q1 to Q4 is set at 5V with the corresponding polarity to ensure that they are all reverse biased, as noted by label V×1, in plots 3 and 4 of the figure. The inductor drive return circuits A and B are active at this stage as indicated in plots 5 and 6. The turn-on of the switch is accomplished by forward biasing the transistors Q1 to Q4. The base emitter voltage of all the four transistors Q1 to Q4 is changed to 0.7V with the corresponding polarity to ensure that they are all forward biased, as noted by label V×2, in plots 3 and 4 of the FIG. 5. This action happens during the dead time start after the completion of the full switching cycle. In this case it is after the completion of the third full switching cycle as indicated on plots 3, 4 and 5. The normal dead time between the switching cycles is denoted as Deadtime A. The dead time required for the apparatus to be switched on is denoted as Deadtime B. For off to on operation of the switch, Deadtime B can be equal to or greater than Deadtime A. The latching switch is on and in the subsequent switching cycle the same current flows through the inductors L1 and L2, in both directions, as indicated in plots 1 and 2. The transistors Q1 and Q2 are active in one direction and transistor Q4 and Q3 are active in the other direction of current flow. The inductor drive return circuits A and C drive and return the same current through the coils. This is indicated in plots 5 and 7 of FIG. 5

To change the state of the latching switching arrangement from on to off, the transition occurs during the dead time period of the inductor drive return circuits A and C. The Keep On circuits will be deactivated and the Keep Off circuits will be activated during this dead time period. The duration of this dead time can vary depending on the time required to evacuate all the minority charge carriers from the latching transistors Q1 to Q4. Hence, by increasing the dead time between the switching cycles it becomes possible to turn-off the latching transistors Q1 to Q4 by using small control (bias) currents. The coils L1 and L2 will now be electrically isolated from one another. For the next on switching cycle the inductor drive return circuit C will remain inactive and the current flow will be to and from inductor drive return circuit A, coil L1 and inductor drive return circuit B. The Keep Off circuits will remain active therefore it will persist in its bias till the time the bidirectional latching circuit is required to change its state.

Figure 6:
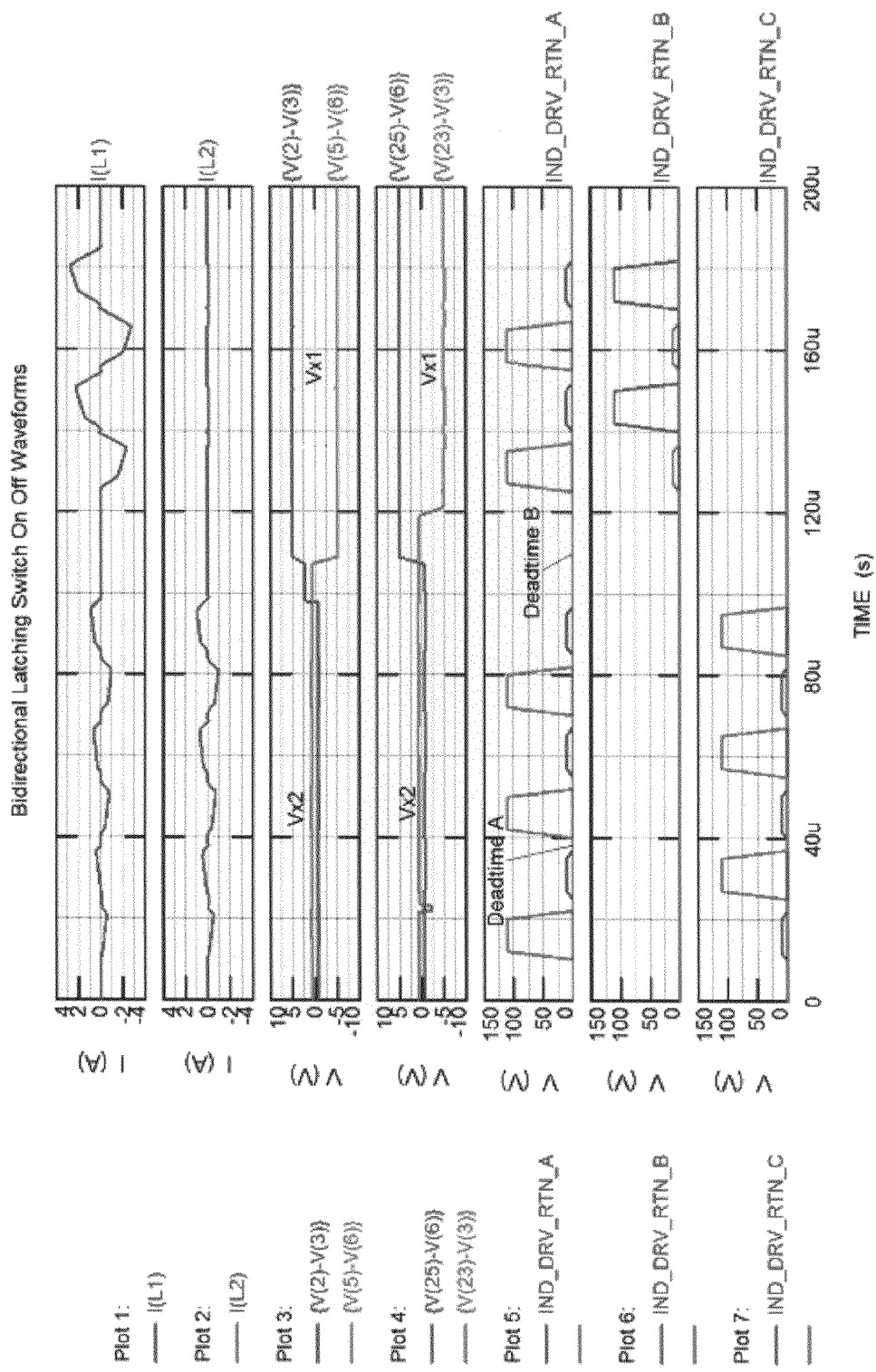
FIG. 6 illustrates bidirectional-latching switch on off waveforms.

The above operation is also illustrated in the waveforms of FIG. 6. The initial state of the switch is on and hence the flow of current is same in both coils L1 and L2. This is indicated in plots 1 and 2. The current is driven by the inductor drive return circuits A and C. This is illustrated in plots 5 and 7. The base emitter voltage of the transistors Q1 to Q4 is set at 0.7V with the appropriate polarity to ensure that they are forward biased, as noted by label V×2, in plots 3 and 4. The turn-off of the switch is accomplished by reverse biasing the transistors Q1 to Q4. The base emitter voltage of all the four transistors Q1 to Q4 is changed to 5V with the corresponding polarity to ensure that they are all reverse biased as noted, by label V×1, in plots 3 and 4 of the figure. This action happens during the dead time start after the completion of the full switching cycle. In this case it is after the completion of the third full switching cycle as indicated on plots 3, 4 and 5. The normal dead time between the switching cycles is denoted as Deadtime A. The dead time required for the apparatus to be switched off is denoted as Deadtime B. For on to off operation of the switch, Deadtime B needs to be greater than Deadtime A. This is done to ensure that all the minority charge carriers are evacuated from the transistors Q1 to Q4 for proper turn-off. With the latching switch off, in the subsequent switching cycle, the flow of current is only through coil L1 as indicated in plots 1 and 2. This current is driven by the inductor drive return circuits A and B as illustrated in plots 5 and 6.

An important point to be noted is that the control bias, using a very low current, applied via the Keep_On and Keep_Off circuits for the latching transistors needs to be changed only when the windings are being switched. This bias change happens during the deadtime between switching cycles. As the deadtime can be extended prior to the next switching cycle large dv/dt and di/dt values need not be applied to change the circuit bias. This also ensures EMI/RFI emissions are not an issue when using this switching arrangement.

Optionally turn-on and turn-off indication circuits can provided with the Keep_On and Keep_Off circuits to measure the voltage difference between the base and emitter of the latching transistors Q1 to Q4. This may be used as an input to the system controller to indicate when the latching transistor attains on or off state after the command has been given to the Keep_On or Keep_Off circuits of the latching switch. These circuits will enable a faster and more reliable system response.

The exemplary implementation of the switching devices illustrated above will now be discussed. It should be noted that these discussed implementations are for the bidirectional latching switch only.

Figure 7:
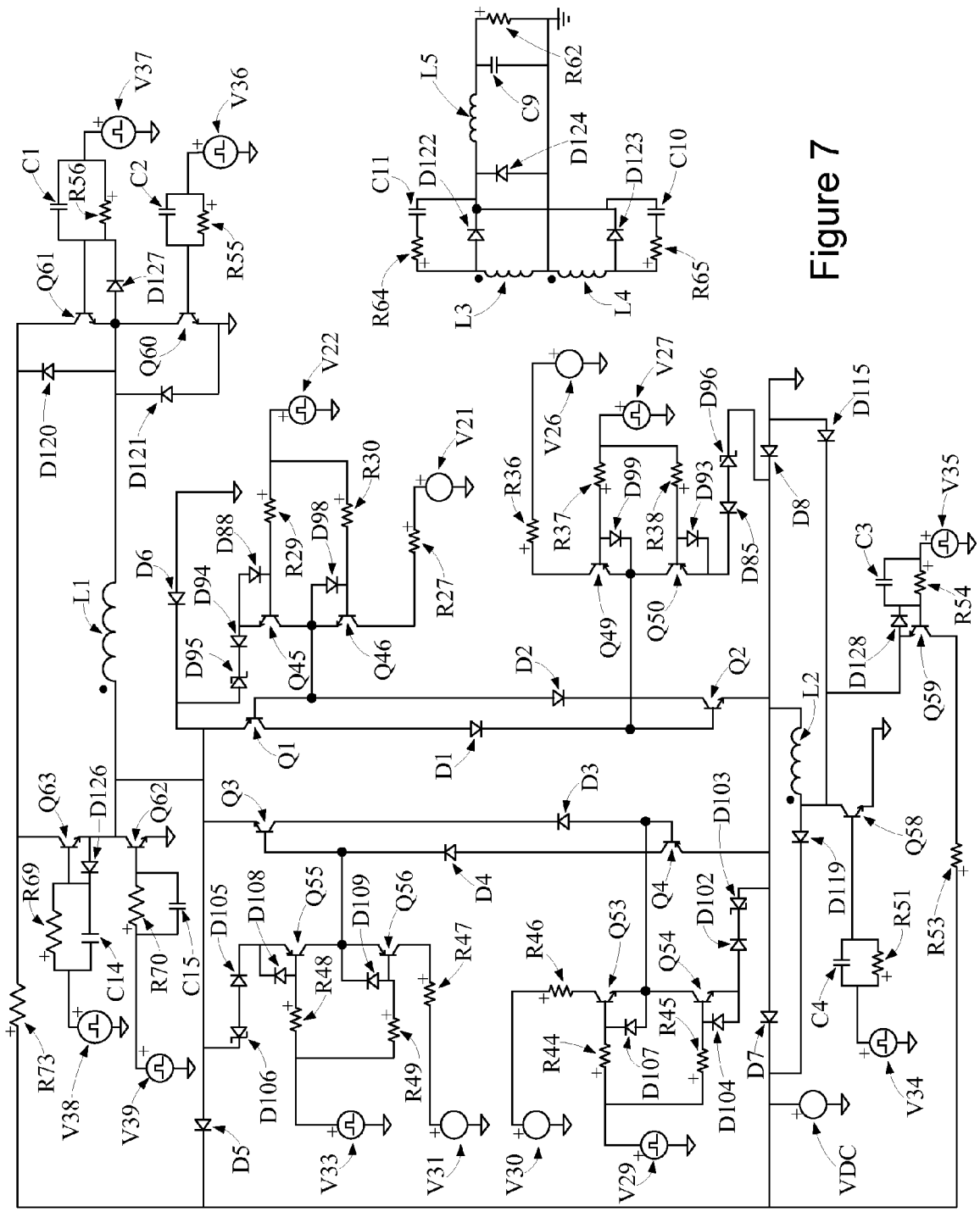
FIG. 7 illustrates an exemplary implementation of the bidirectional latching switch apparatus according to an embodiment of the invention.

The diagram shown in FIG. 7 shows an exemplary implementation of the disclosed bidirectional switching apparatus. The transistors Q1, Q2, Q3 and Q4 are the latching transistors and diodes D1, D2, D3, D4, D5, D6, D7 and D8 corresponding to the equivalent components of FIG. 4. Transistors Q60 and Q61 represent the inductor drive return circuit A, Transistors Q62 and Q63 represent the inductor drive return circuit B and transistor Q58 and Q59 represent the inductor drive return circuit C. Inductors L3 and L4 and their associated circuitry represent the secondary side circuit of the mutually coupled inductors L1 and L2.

The Keep_On and Keep_Off circuits for PNP transistor Q1 are represented by transistors Q45 and Q46 and their associated circuit components. The voltage source V22 represents the signal from the system controller which drives the said transistors. Diodes D88 and D98 are there to prevent excessive reverse voltages from damaging the base emitter junctions of the transistors Q45 and Q46. Diode D98 also provides the forward bias for the latching transistor Q1 via voltage source V22 so that Q1's base voltage is held negative with respect to the emitter. Hence if the voltage source V22 supplies a negative voltage say vin1 to the input of the transistors then it applied directly to the base of the Q1 latching transistor via diode D98 making it forward biased. The Keep_On circuit for Q1 is now active. It should be noted that this negative vin1 voltage can be equal in magnitude or less than the maximum rectified DC voltage V DC input to the convertor, to ensure that Q1 remains forward biased under all circuit conditions. The current supplied by the voltage source V22 to the base of transistor Q1 is of the order of a few milliamps. This Keep_On condition facilitates the flow of current from the inductor drive return circuit A to inductor drive return circuit C.

When the voltage source V22 swings to a positive voltage vin2 then this forward biases the transistors Q45 and Q46. The Keep_Off circuit for Q1 is now active. This brings the diodes D94 and D95 into conduction via voltage source V21. It should be noted that the positive voltage vin2 magnitude and voltage source V21 magnitude has to be greater than maximum DC rectified voltage VDC applied to the convertor. The total voltage applied across the emitter base of transistor Q1 is sum of the voltage drops of D94 and D95. The diode D95 is a zener diode which conducts heavily when its breakdown voltage Vz is exceeded. The total reverse voltage applied to the emitter base of Q1 is Vz+Vd. For typical silicon diodes Vd is 0.7V and for silicon transistors Vz+Vd should be approximately 5V. Once the minority charge carriers have been evacuated from Q1 then voltage across emitter base junction will rise to 5V. This will effectively reverse bias the transistor Q1 and turn it off. The minimum current flowing through the emitter of the transistor Q45 has to be greater than minimum current required by the zener diode Iz to sustain its breakdown voltage. This current requirement is typically within a few milliamps. It should be noted that the current requirement for reverse bias is much higher than compared with the forward bias, though both of them will be in milliamps. With the reverse voltage Vd+Vz applied across its base emitter junction the depletion layer capacitance of Q1 is at its maximum and it will remain off even though the voltage at its emitter will see a wide variation from 0V to maximum DC rectified voltage V DC applied to the convertor. This Keep_Off condition will permit current flow from Inductor Drive return circuit A to Inductor Drive Return Circuit B Similarly for NPN transistor Q2 the Keep_On and Keep_Off circuits are represented by transistors Q49 and Q50. The diodes D93 and D99 are there to prevent damage to the base emitter junctions of the transistors Q49 and Q50 due to excessive reverse voltages. The voltage source V27 represents the signal from the controller which determines the bias on the transistor Q2 via the transistors Q49 and Q50. V26 is the supply to these transistors. When the V27 is positive the forward bias is applied directly to the base of transistor Q2 via diode D99. At this stage, the Keep_On circuit for transistor Q2 is active. The V27 applied voltage has to be greater in magnitude than maximum DC rectified voltage V DC applied to the convertor. This ensures forward bias for transistor Q2 under all circuit conditions. The current requirement to keep Q2 forward biased is of the order of a few milliamps. With transistors Q1 and Q2 forward biased current flow is from L1 to Q1 to Q2 to L2.

When voltage source V27 swings to a negative voltage it forward biases the transistors Q49 and Q50 via negative voltage source V26. The magnitude of this negative voltage source has to equal to or less than the magnitude of the maximum DC rectified V DC voltage applied to the convertor. At this stage, the Keep_Off circuit for transistor Q2 is active. Forward biasing of Q50 also brings diodes D85 and D96 into conduction. The voltage applied across the base of Q2 is the sum of the voltage drops of D85 and D96. D96 is a zener diode which conducts heavily when its breakdown voltage Vz is exceeded. The total reverse voltage applied to the emitter base of transistor Q1 is −(Vz+Vd). For typical silicon diodes Vd is 0.7V and for silicon transistors −(Vz+Vd) should be approximately −5V. Once the minority charge carriers have been evacuated from transistor Q2 then voltage across emitter base junction will rise to −5V. This will effectively reverse bias the transistor Q2 and turn it off. The minimum current flowing through the emitter of the transistor Q50 has to be greater than minimum current required by the zener diode Iz to sustain its breakdown voltage. This current requirement is typically within a few milliamps. It should be noted that the current requirement for reverse bias is much higher than compared with the forward bias, though both of them will be in milliamps. With the reverse voltage −(Vd+Vz) applied across its base emitter junction the depletion layer capacitance of transistor Q2 is at its maximum and it will remain off even though the voltage at its emitter will see a wide variation from 0V to maximum DC rectified voltage V DC applied to the convertor. With transistor Q1 and Q2 reverse biased ie in Keep_Off condition, the current flow is from Inductor drive return circuit A to L1 to inductor drive return circuit B and back.

The Keep_On and Keep_Off circuits for PNP transistor Q4 are represented by transistors Q53 and Q54 and their associated circuit components. The voltage source V29 represents the signal from the system controller which drives the said transistors. Diodes D104 and D107 are there to prevent excessive reverse voltages from damaging the base emitter junctions of the transistors Q53 and Q54. Diode D107 also provides the forward bias for the latching transistor Q4 via voltage source V29 so that Q4's base voltage is held negative with respect to the emitter. Hence if the voltage source V29 supplies a negative voltage vin1 to the input of the transistors then it is applied directly to the base of the Q4 latching transistor via diode D107 making it forward biased. The Keep_On circuit for Q4 is now active. It should be noted that this negative vin1 voltage can be equal in magnitude or less than the maximum rectified DC voltage V DC input to the convertor to ensure that transistor Q4 remains forward biased under all circuit conditions. The current supplied by the voltage source V29 to the base of transistor Q1 is of the order of a few milliamps. The Keep_On condition of transistor Q4 facilitates the flow of current from inductor drive return circuit C to Inductor L2 to L1 to inductor drive return circuit A.

When the voltage source V29 swings to a positive voltage vin2 then this forward biases the transistors Q53 and Q54. This brings the diodes D102 and D103 into conduction via voltage source V30. The Keep_Off circuit for transistor Q4 is now active. It should be noted that the positive voltage vin2 magnitude and voltage source V30 magnitude has to be greater than maximum DC rectified voltage V DC applied to the convertor. The total voltage applied across the emitter base of transistor Q1 is sum of the voltage drops of D102 and D103. The diode D103 is a zener diode which conducts heavily when its breakdown voltage Vz is exceeded. The total reverse voltage applied to the emitter base of transistor Q1 is Vz+Vd. For typical silicon diodes Vd is 0.7V and for silicon transistors Vz+Vd should be approximately 5V. Once the minority charge carriers have been evacuated from transistor Q4 then voltage across emitter base junction will rise to 5V. This will effectively reverse bias the transistor Q4 and turn it off. The minimum current flowing through the emitter of the transistor Q54 has to be greater than minimum current required by the zener diode Iz to sustain its breakdown voltage. This current requirement is typically within a few milliamps. It should be noted that the current requirement for reverse bias is much higher than compared with the forward bias, though both of them will be in milliamps. With the reverse voltage Vd+Vz applied across its base emitter junction the depletion layer capacitance of transistor Q4 is at its maximum and it will remain off even though the voltage at its emitter will see a wide variation from 0V to maximum DC rectified voltage V DC applied to the convertor. This condition facilitates the flow of current from inductor drive return circuit A to L1 to inductor drive return circuit B and back.

The control bias for the transistors Q1 and Q4 is common thus it should be noted that the control bias voltage sources V29 and V22 are actually the same. Similarly the DC voltage sources V21 and V30 are also the same. They have only been show separately for reasons of clarity in the diagram.

NPN transistor Q3, the Keep_On and Keep_Off circuits are represented by transistors Q55 and Q56. The diodes D108 and D109 are there to prevent damage to the base emitter junctions of the transistors Q55 and Q56 due to excessive reverse voltages. The voltage source V33 represents the signal from the controller which determines the bias on the transistor Q3 via the transistors Q55 and Q56. V31 is the supply to these transistors. When the V33 is positive the forward bias is applied directly to the base of transistor Q3 via diode D109. The Keep_On circuit for transistor Q3 is now active. The V33 applied voltage has to be greater in magnitude than maximum DC rectified voltage V DC applied to the convertor. This ensures forward bias for transistor Q3 under all circuit conditions. The current requirement to keep transistor Q3 forward biased is of the order of a few milliamps. With transistor Q4 and Q3 forward biased current flow is from inductor drive return circuit C to L2 to Q4 to Q3 to L1 to inductor drive return circuit A When voltage source V33 swings to a negative voltage it forward biases the transistors Q55 and Q56 with negative voltage source V31 supplying the current to the conducting diodes D105 and D106. The Keep_Off circuit for the transistor Q3 is now active. The magnitude of this negative voltage source has to equal to or less than the magnitude of the maximum DC rectified voltage V DC applied to the convertor. The voltage applied across the base of transistor Q3 is the sum of the voltage drops of D105 and D106. D106 is a zener diode which conducts heavily when its breakdown voltage Vz is exceeded. The total reverse voltage applied to the emitter base of Q3 is −(Vz+Vd). For typical silicon diodes Vd is 0.7V and for silicon transistors −(Vz+Vd) should be approximately −5V. Once the minority charge carriers have been evacuated from transistor Q3 then the voltage across emitter base junction will rise to −5V. This will effectively reverse biases the transistor Q3 and turns it off. The minimum current flowing through the emitter of the transistor Q55 has to be greater than minimum current required by the zener diode Iz to sustain its breakdown voltage. This current requirement is typically within a few milliamps. It should be noted that the current requirement for reverse bias is much higher than compared with the forward bias, though both of them will be in milliamps. With the reverse voltage −(Vd+Vz) applied across its base emitter junction the depletion layer capacitance of transistor Q3 is at its maximum and it will remain off even though the voltage at its emitter will see a wide variation from 0V to maximum DC rectified voltage applied to the convertor. This condition facilitates the flow of current from inductor drive return circuit A to L1 to inductor drive return circuit B and back.

To reiterate the Keep_On circuit of all the four latching transistors will be on simultaneously or the Keep_Off circuit for all the four latching transistors will be on simultaneously. The Keep_On and Keep_Off circuits operate in mutually exclusive fashion and are switched on or off only during the deadtime between the switching cycles.

The control bias voltage sources V27 and V33 are the same as the bias for the transistors Q2 and Q3 is the same. Similarly the DC voltage source V31 and V26 are also the same. They have only been shown separately for the purposes of clarity in the diagram.

One problem with the above circuit is that if the latching circuit is kept off then due to the minimum current requirements of the zener diodes, to maintain the reverse bias voltage across the base emitter junctions of the transistors, the current drawn from the voltage sources V21, V26, V30 and V31 can be more than double of that required when the emitters of the latching transistors Q1, Q2, Q3 and Q4 are driven to ground by their respective inductor drive return circuits. This can result in an increase of more than four times the power consumption of each latching transistors Keep_Off circuit.

Figure 8:
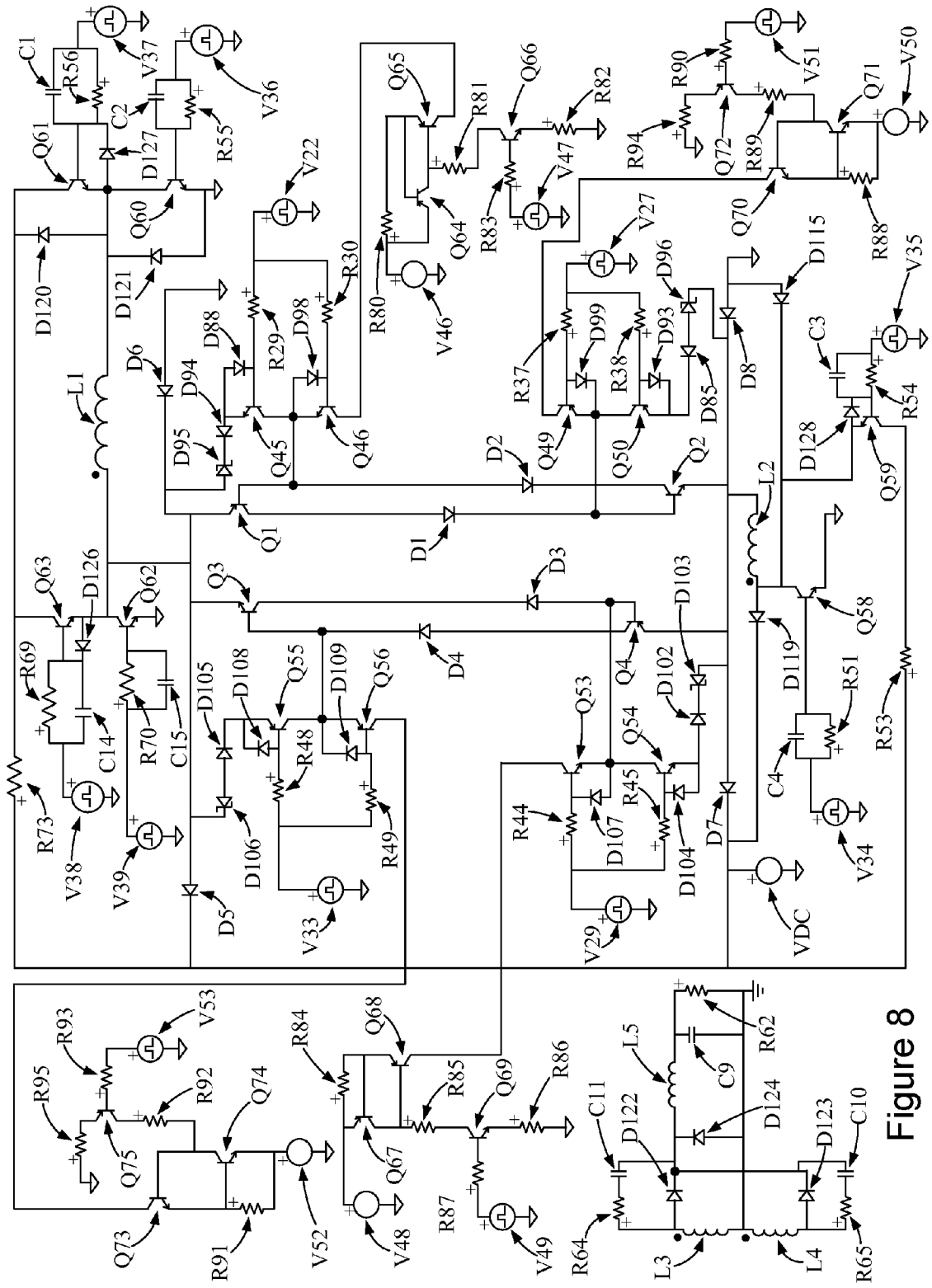
FIG. 8 illustrates an exemplary implementation of the bidirectional switching apparatus according to another embodiment of the invention.

To alleviate this problem the diagram in FIG. 8 shows a circuit according to another embodiment of the invention in which the voltage sources V21, V26, V30 and V31 have been replaced by current sources or sinks with a high compliance. All other aspects of the circuit remain the same. Current sources or current sinks may be programmed to source or sink only a specific current due to high (ideally infinite) output impedance across all circuit conditions.

The voltage sources V21 and V30 have been replaced by similar current sources. Transistors Q64, Q65 and Q66 form the current source in place of V21. The current is determined by the relation Vbe(Q64)/R80. Typically Vbe is 0.7V for silicon transistors. This programs the collector current for transistor Q65 which sources the current to the Keep_Off circuit for transistor Q1. Transistor Q66 turns on the current source according to the command provided by the system controller via voltage source V47.

Similarly in place of voltage source V30 the current source circuit consists of transistors Q67, Q68 and Q69. The current is determined by Vbe(Q67)/R84. This value programs the collector current for transistor Q68 which sources the current for the Keep_Off circuit for transistor Q4. Transistor Q69 turns on the current source according to the command provided by the system controller via voltage source V49.

The system controller voltage sources V47 and V49 are the same but have been shown separately for the purpose of clarity in the diagram. Similarly the DC voltage sources are V46 and V48 are also the same.

The negative voltage sources V26 and V31 have been replaced by current sinks Transistors Q70, Q71 and Q72 form the current sink in place of V26. The sink current is determined by Vbe(Q71)/R88. This programs the collector current for transistor Q70 which sinks current from the Keep_Off circuit of transistor Q2. Transistor Q72 turns on the current sink according to the command provided by the system controller via voltage source V51.

Similarly in place of negative voltage source V31 the current sinks consists of transistor Q73, Q74 and Q75. The sink current is determined by Vbe(Q74)/R91. This value programs the collector current for transistor Q73 which sinks current from the Keep_Off circuit of transistor Q3. Transistor Q75 turns on the current sink according to the command provided by the system controller via voltage source V53.

The system controller sources V51 and V53 are the same but have been shown separately for the purpose of clarity in the diagram. Similarly the DC voltage sources are V50 and V52 are also the same.

An important point to be noted is that the latching switch arrangement may be used to dynamically connect more than two mutually coupled inductive coils. For example incase of interleaved transformer windings, two bidirectional transistor latching switches may be used to connect three inductive coils in the ratio of 1/2 L L 1/2 L. Based on circuit requirements two or more mutually coupled inductive coils can be connected using one or more unidirectional or bidirectional latching switches as described above.

To make the switch more efficient the transistors with a higher reverse breakdown voltage may be used as the zener diodes with higher breakdown voltages need lower Iz currents through them to maintain the breakdown voltage. This will improve the power dissipation figures of the latching switch.

While specific language has been used to describe the invention, any limitations arising on account of the same are not intended. As would be apparent to a person in the art, various working modifications may be made to the method in order to implement the inventive concept as taught herein.

I claim:

1. A switching apparatus for dynamically switching in or out a inductor coil from a circuit having at least two mutually coupled inductor coils (L1, L2), driven by a modulated drive circuit(s) having a dead time between the switching cycles, the apparatus comprising:

at least one latching circuit having two bipolar transistors (Q1, Q2) connected in a transistor latch configuration along with at least two diodes (D1, D2), such that at least one diode is connected in series with a base of the each bipolar transistor;

one or more control circuits connected to the latch circuit for operating the bipolar transistors so as to keep the latching circuit on or off;

such that control circuits provide a constant steady forward bias to keep the latch circuit on and a constant steady reverse bias to keep the latch circuit off, the bias being changed only when the inductors coils (L1, L2) need to be switched in (latch circuit on) or out (latch circuit off) of the circuit;

such that to turn on the latching circuit a forward bias voltage is applied during the dead time of the switching cycles and to turn off the latching circuit a reverse bias voltage is applied during the dead time of the switching cycles;

a plurality of diodes (D3, D4, D5, D6) connected in the circuit for protecting the latching circuit and the control circuits from being exposed to high voltages and currents during the turn off or turn on of the inductor coils (L1, L2).

2. The switching apparatus as claimed in claim 1, wherein the switching apparatus have at least two control circuits, such that at least one circuit is connected to each bipolar transistor and the diodes (D1, D2) isolate the control circuits between the bipolar transistors (Q1, Q2) in the latching circuit.

3. The switching apparatus as claimed in claim 1, wherein the control circuit includes at least one keep on circuit and at least one keep off circuit connected to each transistor.

4. The switching apparatus as claimed in claim 1, wherein the coils (L1, L2) have unequal inductance values.

5. The switching apparatus as claimed in claim 1, wherein the coils (L1, L2) have equal inductance value.

6. The switching apparatus as claimed in claim 1, further comprises a turn on/turn off indication circuit coupled with the latching circuit.

7. The switching apparatus as claimed in claim 1, wherein the forward bias voltage is relatively very small as compared to the reverse bias voltage.

8. The switching apparatus as claimed in claim 1, wherein the reverse bias voltage is at least +/−5 volts.

9. The switching apparatus as claimed in claim 1, wherein the bipolar transistors are of PNP configuration.

10. The switching apparatus as claimed in claim 1, wherein the bipolar transistors are of NPN configuration.

11. The switching apparatus as claimed in claim 1, wherein the switching apparatus have only one latching circuit to provide a unidirectional switch configuration.

12. The switching apparatus as claimed in claim 1, wherein the switching apparatus have two latching circuits to provide a bidirectional switch configuration.

* * * * *